United States Patent [19]

Hartmeier

[11] Patent Number: 4,802,009
[45] Date of Patent: Jan. 31, 1989

[54] DIGITALLY CONTROLLED PHASE LOCKED LOOP SYSTEM

[75] Inventor: Werner N. Hartmeier, Geroldswil, Switzerland

[73] Assignee: RCA Licensing Corporation, Princeton, N.J.

[21] Appl. No.: 72,935

[22] Filed: Jul. 13, 1987

[51] Int. Cl.⁴ .............................................. H04N 5/06
[52] U.S. Cl. ..................................... 358/158; 358/140; 358/159; 375/120; 331/25
[58] Field of Search ...................... 358/195.1, 11, 140, 358/158, 148, 188, 159; 375/97, 111, 119, 120; 328/133; 331/17, 25

[56] References Cited

U.S. PATENT DOCUMENTS

| | | | |
|---|---|---|---|
| 4,349,833 | 9/1982 | Clarke | 358/26 |
| 4,476,490 | 10/1984 | Kaneko | 358/148 |
| 4,488,170 | 12/1984 | Nillesen | 358/26 |
| 4,489,342 | 12/1984 | Gollinger et al. | 358/17 |
| 4,500,909 | 2/1985 | Machida | 358/17 |
| 4,520,319 | 5/1985 | Baker | 328/133 |
| 4,600,895 | 7/1986 | Landsman | 331/1 A |
| 4,639,780 | 1/1987 | Willis | 358/158 |
| 4,652,832 | 3/1987 | Jasper | 328/14 |
| 4,679,005 | 7/1987 | Tatami | 331/16 |
| 4,689,582 | 8/1987 | Balaban | 358/158 |

FOREIGN PATENT DOCUMENTS

3432314 3/1986 Fed. Rep. of Germany .

OTHER PUBLICATIONS

Nillesen, A. H. H. J., "Line-Locked Digital Colour Decoding" Electronic Components and Applications, vol. 7, No. 4, 1986, pp. 239-245.
Gruen, W. I., "Theory of AFC Synchronization Proceedings of the IRE", Aug., 1953, pp. 1043-1048.

*Primary Examiner*—Tommy P. Chin
*Attorney, Agent, or Firm*—Eugene M. Whitacre; Paul J. Rasmussen; Eric P. Herrmann

[57] ABSTRACT

A phase locked loop system for generating a line-locked clock signal for a television signal processing system includes an analog phase-locked loop nested within a digital phase locked loop. The analog phase-locked loop is synchronized to a reference signal which is derived from the most significant bit of a digital oscillator signal generated by a clocked digital oscillator. To reduce instability in this reference signal, the ratio of the frequency of the clock signal to the frequency of the digital oscillatory signal is chosen to be a noninteger value greater than two. In one embodiment of the invention the stability of the reference signal is further enhanced by adaptively delaying transitions in the reference signal by amounts of time that are inversely proportional to the value of the less significant bits of the samples corresponding to the transitions.

7 Claims, 3 Drawing Sheets

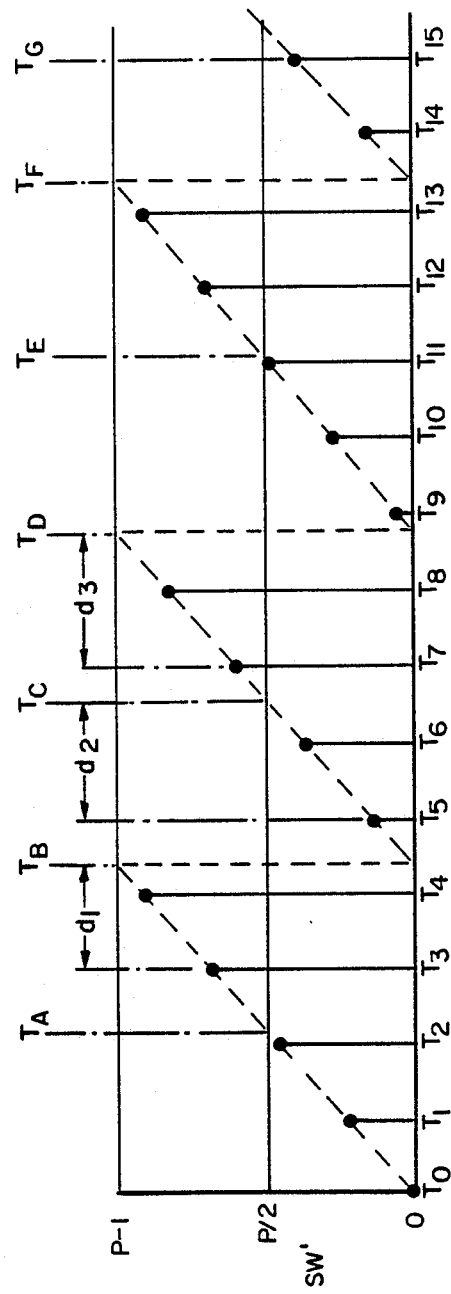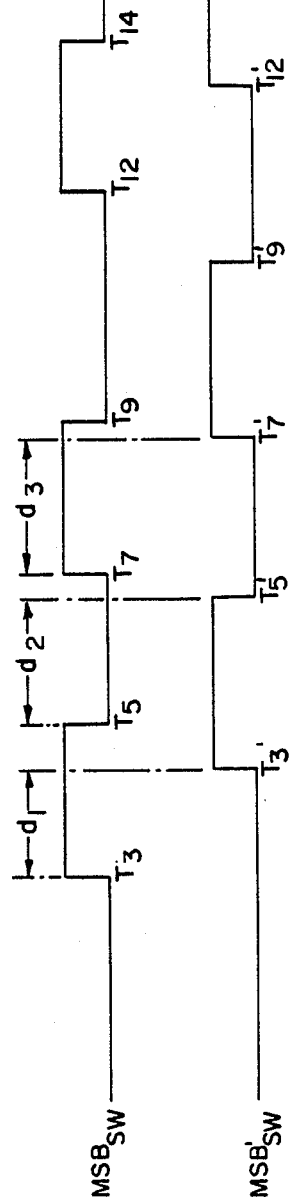

DIGITALLY CONTROLLED PHASE LOCKED LOOP SYSTEM

The present invention relates
loop system which includes analog and digital circuitry.

Recent developments in the field of digital television signal processing have generated interest in digitally controlled phase locked loop (PLL) systems. These systems have been shown to be useful in generating clock signals that are phase-locked to the horizontal line scanning signals used in a multi-standard (i.e. PAL or NTSC) television receiver. A system of this type is described in an article by A. H. H. J. Nillesen entitled "Line-locked Digital Colour Decoding", Electronic Components and Applications, Vol. 7, No. 4, 1986, pp. 239–245, which is hereby incorporated by reference.

The line-locked clock system described in the Nillesen article is shown in FIG. 1, labeled "Prior Art". The system shown in FIG. 1 is a compound phase-locked loop. Generally, an analog PLL 50 is used as a "reconstruction filter" in a digital PLL which also includes a phase comparator 16, a loop filter 18 and a digital oscillator, also known as a discrete time oscillator (DTO) 30. The DTO 30 is clocked, by a crystal controlled clock signal generated by an analog oscillator 40.

The following is a more detailed description of the circuitry shown in FIG. 1. A source of composite video signals 10, which includes a conventional television tuner, IF amplifier and video detector, provides composite video signals to an analog to digital converter (ADC) 12. The ADC 12 digitizes the composite video signals at instants determined by a sampling clock signal, CLOCK, provided by the wave shaping circuitry 58 of the reconstruction filter 50. The digitized composite video signal developed by the ADC 12 is applied to synchronization signal separating circuitry 14. The circuitry 14 extracts the horizontal line synchronizing signal components from the digitized composite video signal and provides these extracted components as a signal HSYNC. The signal HSYNC is applied to one input port of the phase comparator 16. Another input port of the phase comparator 16 is coupled to receive a signal, HS, provided by a counter 60 of the reconstruction filter 50. The counter 60 frequency divides the signal CLOCK to generate the signal HS having a frequency, $F_L$, which approximates the frequency of the horizontal line synchronization signal HSYNC.

The phase comparator 16 generates a signal proportional to the difference in phase between the signals HS and HSYNC. The signal provided by the phase comparator 16 is applied to the loop filter 18. The filter 18 integrates the phase difference signal to produce a signal, FD, which is indicative of the difference in frequency between the signals HS and HSYNC. The signal provided by the loop filter 18 is applied to one input port of an adder 20. The other input port of the adder 20 is coupled to a digital value source 22 which applies a constant digital value K to the adder 20. As described below, the value K determines the free running frequency of the DTO 30.

The signal provided by the adder 20 is applied to one input port of an adder 32 of the DTO 30. The output signal of the adder 32 is applied to the input port of an N-bit parallel-input parallel-output register 34. The output port of the register 34 is coupled to a second input port of the adder 32. The output port of the register 34 is the output port of the DTO 30. The clock input terminal of the register 34 is coupled to receive the signal, CK, provided by the oscillator 40. Synchronous with each pulse of the signal CK, the sum of the value held by the register 34 and the value provided by the adder 20 is stored into the register 34. Since the register 34 is an N-bit register, the largest value which it can hold is $2^N - 1$. When the sum, S, provided by the adder 32 is greater than $2^N - 1$, the value stored in the register 34 is S modulo $2^N$, a value that is less than $2^N - 1$. Consequently, the value, S, provided by the register 34 will increase in value in a stepwise-linear manner over several clock periods and then decrease in value during one clock period. The signal, SW, represented by this changing value is a quantized sawtooth waveform. The frequency, $f_{SW}$, of the signal SW is described by the equation (1)

$$f_{SW} = ((K + FD)/2^N) f_{ck} \qquad (1)$$

where $f_{ck}$ is the frequency of the clock signal CK. The signal SW is applied to the address input port of a read-only memory (ROM) 36. The ROM 36 is programmed to provide output values representing a quantized sine wave signal in response to the values of the quantized sawtooth wave signal SW. The output signal provided by the ROM 36 is applied to a digital-to-analog converter (DAC) 38 which develops an analog signal approximating a sinusoidal signal having a frequency of $f_{SW}$.

The signal provided by the DAC 38 is applied to one input port of a phase comparator 52 of the reconstruction filter 50. A second input port of the phase comparator 52 is coupled to receive a signal, provided by the counter 60, which has a frequency substantially equal to $f_{SW}$. The phase comparator 52 produces an output signal which is proportional to the instantaneous difference in phase between the signals provided by the counter 60 and DAC 38. This output signal is applied to the input terminal of a loop filter 54 which integrates the phase difference signal to develop a signal which is proportional to the difference in frequency between the signals provided by the counter 60 and the DAC 38.

The frequency difference signal provided by the loop filter 54 is applied to the frequency control input terminal of an analog voltage controlled oscillator (VCO) 56. The VCO 56 is conditioned to produce a sinusoidal output signal having a frequency which is an integer multiple of the frequency $f_{SW}$. The signal produced by the VCO 56 is applied to wave shaping circuitry 58 which changes the sinusoidal signal to a square wave signal. The signal provided by the wave shaping circuitry 58 is the signal CLOCK which is applied to the ADC 12 and counter 60 as set forth above.

The PLL system described in the Nillesen article is a dual phase locked loop. An outer digital loop which includes the phase comparator 16, loop filter 18, adder 20, digital value source 22, DTO 30, ROM 36 and DAC 38 controls an inner analog PLL, the reconstruction filter 50. In this dual loop system, the digital loop operates at a relatively low frequency, $f_{SW}$, which is less than the Nyquist limit frequency for the clock signal CK. The signal, SW, produced by the digital PLL is multiplied in frequency by the analog PLL in the reconstruction filter 50 to produce the signal CLOCK. The signal CLOCK is divided in frequency by the counter 60 to produce the signal HS and to produce a signal having substantially the same frequency as the signal SW which is applied to the phase comparator 52.

In the Nillesen system, the digital values produced by the ROM 36 are converted into an analog signal by the DAC 38 for application to the analog phase comparator 52 of the reconstruction filter 50. The DAC 38 and analog phase comparator 52 of the Nillisen system are intended to be realized as a portion of an integrated circuit. Because these circuits are analog, they are very sensitive to variations in design and manufacturing parameters and may be subject to degradation in performance as the integrated circuit ages. It would be desirable if digital circuitry, which is less sensitive to parametric variations and to aging, could be substituted for the DAC 38 and phase comparator 52.

SUMMARY OF THE INVENTION

The present invention is embodied in a partly digital, partly analog phase locked loop system. The system includes an analog oscillator which is responsive to a control signal for generating an analog oscillatory signal. The system further includes a digital oscillator which generates a multi-bit digital oscillatory signal having a frequency which approximates a predetermined frequency. A phase comparator is responsive to the output signal of the analog oscillator and to one of the bits of the multi-bit digital oscillatory signal to develop the control signal applied to the analog oscillator.

BRIEF DESCRIPTION OF THE DRAWING

FIGS. 3A, 3B, 3C and 3D are waveform diagrams of signal amplitude versus time showing signals that are useful for explaining the operation of the circuitry shown in FIG. 2.

DETAILED DESCRIPTION

Figure 1:
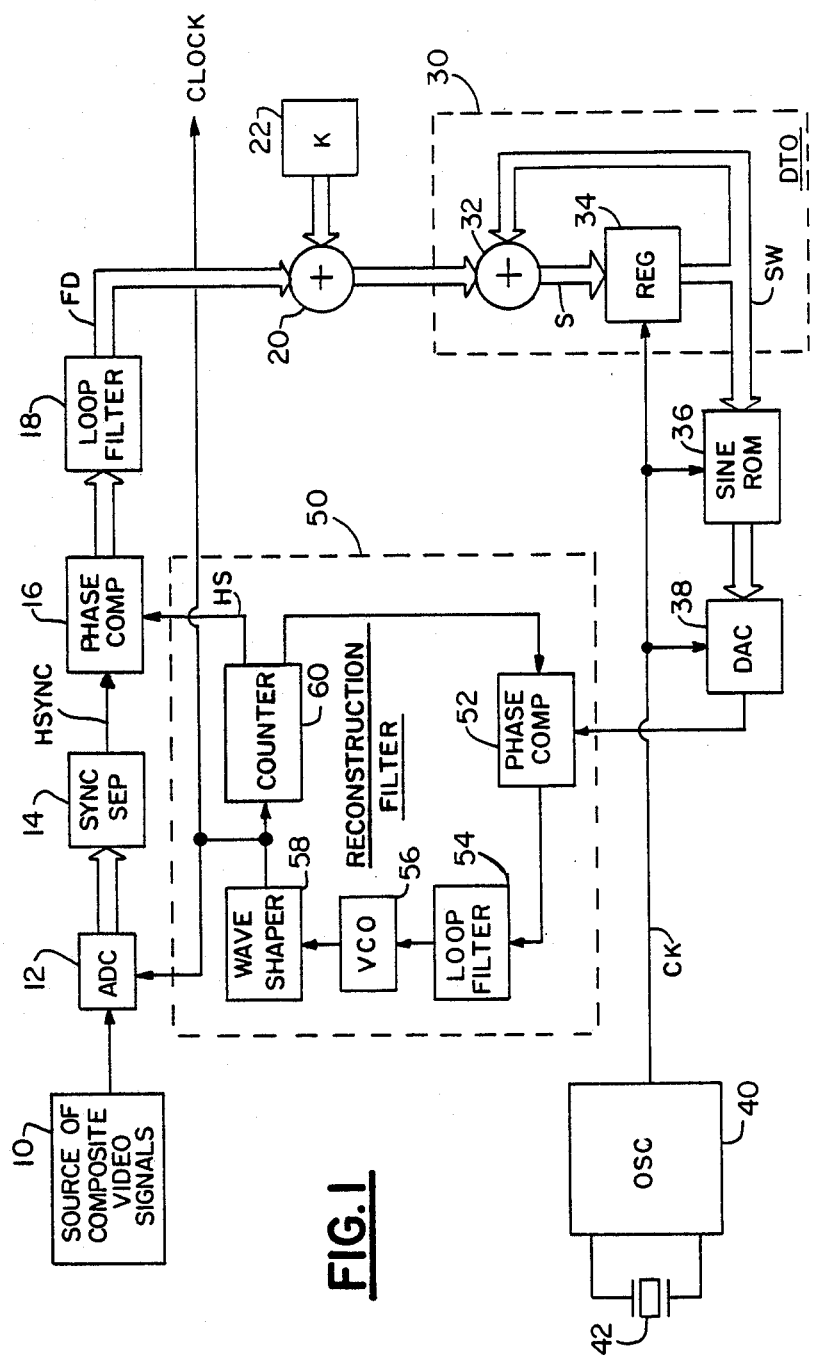
FIG. 1 (prior art) is a block diagram of a partly analog, partly digital phase locked loop system, previously described.

In the drawings, broad arrows represent busses for conveying multiple-bit parallel digital signals and line arrows represent connections for conveying analog signals or single-bit digital signals. Depending on the processing speed of the devices, compensating delays may be required in certain of the signal paths. One skilled in the art of digital and analog signal processing circuit design would know where such delays would be needed in a particular system.

Figure 2:
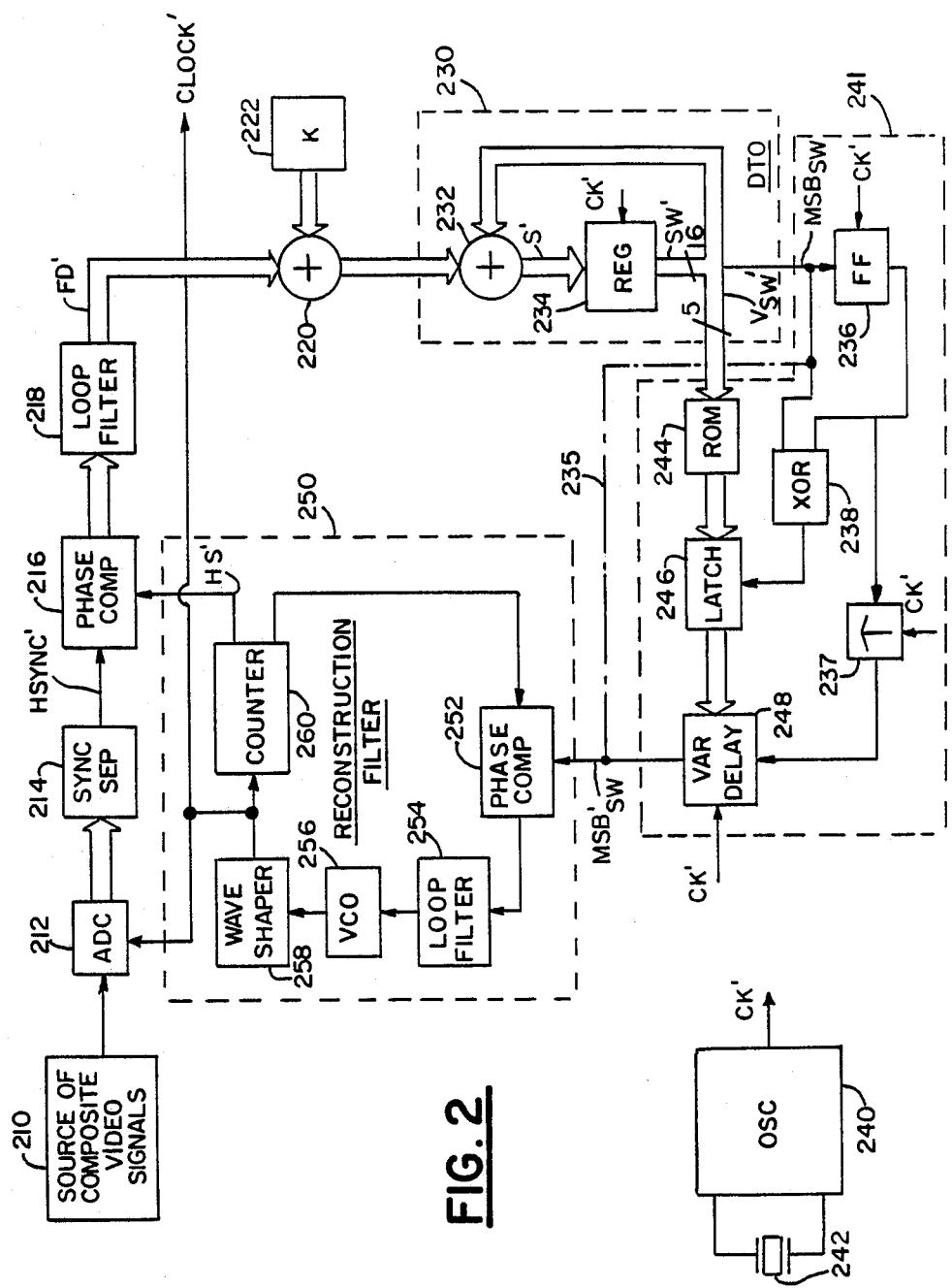
FIG. 2 is a block diagram of a partly analog, partly digital phase locked loop system incorporating the present invention.

FIG. 2 is a block diagram of a partly digital, partly analog phase locked loop system which includes the present invention. The circuitry shown in FIG. 2 is analyzed in the context of an NTSC television signal processing system. The items which may be different for the circuitry to operate in a PAL television signal processing system are noted in parentheses where appropriate.

In FIG. 2, a source 210 provides composite video signals to an ADC 212. The ADC 212 samples the signals provided by the source 210 using a sampling clock signal, CLOCK', which has a frequency substantially equal to, for example, 13.5 MHz. The signal CLOCK' is provided by the reconstruction filter 250 as set forth below. The digitized composite video signal developed by the ADC 212 is applied to synchronizing signal separating circuitry 214 which extracts the horizontal line synchronizing signal components from the digitized composite video signal and provides the extracted signal components as a signal HSYNC' to a phase comparator 216. The phase comparator 216 which, in this embodiment of the invention, is identical to the phase comparator 16 described in reference to FIG. 1, provides an output signal representing the instantaneous difference in phase between the signal HSYNC' and a signal HS', having approximately the same frequency as the signal HSYNC'. The signal HS' is generated by a counter 260 which divides the frequency of the signal CLOCK' by 858 (864 for PAL).

The phase difference signal generated by the phase comparator 216 is applied to a loop filter 218. The filter 218 integrates the phase difference signal to generate a signal, FD', representing the difference in frequency between the signals HSYNC' and HS'. The signal FD' is summed by an adder 220 with a digital value K, provided by a digital value source 222. In the present embodiment of the invention, K is equal to 14,564. The signal developed by the adder 220 is applied to a DTO 230 which includes an adder 232 and a 16-bit, parallel-input parallel-output register 234. The sample values provided by the adder 220 are summed with the value held in the register 234 by the adder 232, the resultant sum is loaded into the register 234 synchronous with the positive-going o transitions of a 20 MHz clock signal CK'. The signal CK' is provided by a conventional resonant crystal controlled oscillator 240. The output signal, SW', of the DTO 230 is the successive sample values provided by the register 234.

As set forth above, the signal provided by a DTO may be considered to be a quantized sawtooth signal having a frequency which depends on the frequency of the clock signal and the value of the increment signal applied to the DTO. In the present embodiment of the invention, when the signal FD' provided by the loop filter 218 is zero valued, the value in the register 234 will be incremented by the value K=14,564 for each cycle of the 20 MHz clock signal CK'. Table I illustrates successive sample values of the signal SW'.

TABLE I

| TIME | SW' |
|---|---|
| $T_0$ | 0 |
| $T_1$ | 14,746 |
| $T_2$ | 29,492 |
| $T_3$ | 44,238 |
| $T_4$ | 58,894 |
| $T_5$ | 8,194 |
| $T_6$ | 22,940 |
| $T_7$ | 37,686 |
| $T_8$ | 52,432 |
| $T_9$ | 1,642 |
| $T_{10}$ | 16,388 |
| $T_{11}$ | 31,134 |
| $T_{12}$ | 45,880 |
| $T_{13}$ | 60,626 |
| $T_{14}$ | 9,836 |
| $T_{15}$ | 24,582 |

The values in Table I are shown graphically in FIG. 3A. The times $T_0$–$T_{15}$ occur coincident with the positive going edges of the clock signal CK' and correspond to instants at which the value provided by the adder 232 are loaded into the register 234. In FIG. 3A, the sawtooth waveform of the signal SW' is shown by the broken line connecting the sample points. in FIG. 3A, the value P-1 represents the largest value which can be held by the register 234 (i.e. 65,535 or $2^{16}-1$). The value P/2 corresponds to 32,768 (i.e. $2^{15}$). When the signal FD' is nonzero, the value of the increment applied to the DTO is changed. The increment value is greater when FD' is greater than zero and less when FD' is less than zero. As set forth above, the frequency of the signal produced by the DTO is directly proportional to the increment value.

In a first embodiment of the invention to be described, a signal $MSB_{sw}$, representing the most significant bit (MSB) of the signal SW' is applied as a reference signal to the phase comparator 252 of the reconstruction filter 250. The connection applying the signal $MSB_{sw}$ to the phase comparator 252 is illustrated by the alternating long and short dashed line 235. The signal $MSB_{sw}$ is shown in FIG. 3C. This signal has a value of logic zero when the sample values of the signal SW' are less than P/2 and a value of logic one when the sample values the signal SW' are greater than or equal to P/2. The signal $MSB_{sw}$ may be considered to be the superposition of a signal having a frequency of $f_{sw}$, the frequency of the signal SW', and of a beat signal having a frequency related to the harmonics and subharmonics of the respective signals SW' and CK'. The frequency of the beat signal component has a fundamental component that is substantially equal to the difference between the frequency, $f_{sw}'$, and the subharmonic of the signal CK' which is closest in frequency to $f_{sw}$. In the present embodiment of the invention, $f_{sw}'$ is 4.5 MHz and $f_{ck}'$, the frequency of the clock signal CK', is 20 MHz. Accordingly, the beat signal has a fundamental frequency substantially equal to 500 KHz, (5 MHz-4.5 MHz). It is contemplated that other combinations of clock frequency and sawtooth wave frequency may be used as long as two limitations are observed: first, the ratio of the frequency of the clock signal to the frequency of the sawtooth wave should be greater than two to satisfy the Nyquist criterion; second, this ratio should be a noninteger value having a fractional part that is large enough to ensure that the fundamental component of the beat frequency will be outside of the tracking range of the reconstruction filter 250 ADC. In general, the frequency of the fundamental component of the beat signal is largest when the fractional part of the ratio is one-half. As set forth below, the fundamental component of the beat signal is substantially attenuated by the reconstruction filter 250.

A phase comparator 252 suitable for use in this embodiment of the invention is described in U.S. Pat. No. 4,520,319, entitled "Electronic Phase Detector Having An Output Which Is Proportional To The Phase Difference Between Two Data Signals", which is hereby incorporated by reference. The signal provided by this phase comparator has an average magnitude which is proportional to the difference in phase between the signal $MSB_{sw}$ and a signal having a frequency approximately equal to $f_{sw}'$ that is generated by the counter 260 in response to the signal CLOCK'. This phase difference signal is applied to a loop filter 254. The filter 254 integrates the phase difference signal to provide a signal which is proportional to the difference in frequency between the signal $MSB_{sw}$ and the signal provided by the counter 260 to the phase comparato 252. This frequency difference signal is applied to a conventional analog VCO 256 which produces a sinusoidal output signal having a frequency of approximately 13.5 MHz. The output signal of the VCO 256 is applied to wave shaping circuitry 258 which converts the sinusoidal signal to a square wave signal. The square wave signal generated by the wave shaping circuitry 258 is applied to the counter 260 to complete the loop. The output signal of the wave shaping circuitry 258 is the output signal, CLOCK', of the PLL system shown in FIG. 2.

The counter 260 used in this embodiment of the invention is a cascade combination of two counters. The first counter (not shown) produces an output pulse for every three pulses of the signal CLOCK'. The output signal of this counter is applied to the phase comparator 252. The second counter (not shown) produces an output pulse for every 286 (288 for PAL) pulses of the signal provided by the first counter. The output signal of the second counter is the signal HS' which is applied to the phase comparator 216 as set forth above.

In this first embodiment of the invention, the reconstruction filter 250 acts to substantially attenuate the beat frequency components of the MSB of the signal SW' and to multiply the frequency of its 4.5 MHz signal component to obtain the 13.5 MHz signal, CLOCK'.

As set forth above, the frequency of the beat signal components of the signal $MSB_{sw}$ depends on the relative frequencies of the harmonics and subharmonics of the signals SW' and CK'. In the embodiments of the invention illustrated in FIG. 2, the frequency of the signal SW' changes to track changes in the frequency of the signal HSYNC' provided by the synchronizing signal separation circuitry 214. It has been determined by the inventor that when the composite video signals provided by the source 210 are provided by a nonstandard source, such as a video tape recorder (VTR), the signal HSYNC' may vary in frequency by as much as five percent from its nominal value. Consequently, the signals SW' and CK' may generate fundamental beat signal frequencies ranging between 275 KHz and 500 KHz.

The reconstruction filter 250 acts to attenuate these beat signal components because the passband of filter 250 encompasses only those frequencies which differ by approximately 15 KHz from a center frequency of three times the frequency of the signal SW'. The pass-bandwidth of the reconstruction filter 250 is determined, by the loop time constant of the PLL which constitutes the filter 250. This time constant, which defines the frequency tracking range of the PLL, may be selected by adjusting the gain of the various elements in the PLL as described in an article by Wolf J. Gruen entitled "Theory of AFC Synchronization", Proceedings of the IRE, August 1953, pp. 1043–1048, which is hereby incorporated by reference.

Since the fundamental frequency of the beat signal component of the signal $MSB_{sw}$ is outside of pass-band of the reconstruction filter 250, the signal, CLOCK', produced by the filter is relatively free of distortion related to this fundamental frequency component of the beat signal.

Distortion from the beat signal is not entirely absent from the signal CLOCK', however. To understand the nature of this residual distortion, consider the frequency spectrum of the signal $MSB_{sw}$ This signal may be modeled as a square wave signal derived from a superposition of a first sinusoidal signal having a frequency of $f_{sw}$ and a second signal which is not necessarily sinusoidal, having the frequency spectrum of the beat signal. It is well known that the frequency spectrum of a square wave includes the fundamental frequency and its odd harmonic frequencies. Consequently, the frequency spectrum of the signal represented by the signal $MSB_{sw}'$ includes components at the odd harmonic frequencies of each of the components of the beat signal as well as the odd harmonic components of the signal SW'. When the components of the beat signal have relatively large amplitude values and frequencies that lie within the pass-band of the reconstruction filter, they may cause significant distortion in the signal CLOCK'.

This distortion is substantially eliminated by circuitry delineated by the broken line block, 241. The circuitry 241 delays the negative and positive going edges of the signal MSB$_{sw}$ by varying amounts of time to substantially eliminate any distortion of the signal MSB$_{sw}$ that is related to the beat signal.

In this embodiment of the invention, the amount of time by which a given transition of the signal MSB$_{sw}$ is to be delayed is determined by examining five bits of the corresponding sample value of the signal SW', having less significance than the MSB. As set forth above, and as shown in FIG. 3A, the sample values provided by the DTO 230 correspond to samples of a sawtooth waveform having a frequency of $f_{sw}'$. Since the signal SW' is a sawtooth wave signal having known minimum and maximum amplitude values, the timing of a given sample relative to the start of a period of the sampled waveform is proportional to the value of the sample. For example, in the example shown in FIG. 3, the signal SW' has a minimum value of zero and a maximum value of $P-1$. A sample at the midpoint of a period of the signal SW' has a value of $P/2$. In the present example, the value P is $2^{16}$ (65,536). Accordingly, the sample value which corresponds to the midpoint of a period of the signal SW' is $2^{15}$ (32,768). This sample value has a logic one in the 16th or MSB position and logic zeros in the 15 least significant bit (LSB) positions. In this example, therefore, the value of the 15 LSB's of a sample of the signal sw' are indicative of the timing of the sample relative to the beginning or midpoint of a period of the signal SW' when the MSB of the sample is logic zero or logic one, respectively. Consequently, the 15 LSB's of the sample value corresponding to a transition of the signal MSB$_{sw}$ can be used to adjust a programmable delay element to align the transition with the beginning or midpoint of a period of the signal SW'.

Referring to FIG. 2, the signal MSB$_{sw}$ is applied to the input terminal of a conventional D-type flip-flop 236. The flip-flop 236 delays the signal MSB$_{sw}$ by one period of the signal CK', applied to the flip-flop 236 by the oscillator 240. The signal MSB$_{sw}$ and the delayed signal provided by the flip-flop 236 are applied to respectively different input terminals of an exclusive-OR gate 238. The gate 238 is a transition detector for the signal MSB$_{sw}$. It produces a logic one output signal only when the delayed MSB$_{sw}$ signal provided by the flip-flop 236 differs from the undelayed signal MSB$_{sw}$ provided by the DTO 230. The signal V$_{sw}$, the five MSB's of the 15 LSB's of the signal SW', is applied to the address input port of a ROM 244. The output port of the ROM 244 is coupled to the input port of a latch 246. The latch 246 is controlled to load a new value when the exclusive OR gate 238 has a value of logic one.

On the occurrence of a transition, the five-bit output value provided by the ROM 244 in response to the signal V$_{sw}$ is loaded into the latch 246. The output port of the latch 246 is coupled to the control input port of a variable delay element 248. The signal input port of the delay element 248 is coupled to receive the delayed signal MSB$_{sw}$ provided by the flip-flop 236 as further delayed by a compensating delay element 237. The delay element 237 delays the individual transitions in signal MSB$_{sw}$ by an amount of time sufficient to match the transitions to the respective delay element control values produced by the ROM 244.

The variable delay element 248 used in this embodiment of the invention is a chain of 31 pairs of inverters (not shown). The output terminal of each pair of inverters is coupled to a respectively different input port of a multiplexer (not shown). The five-bit control signal provided by the ROM 235 is coupled to the control input port of the multiplexer to select either the input signal to the delay element 248 or the output signal provided by one of the 31 pairs of inverters as the output signal, MSB'$_{sw}$ of the variable delay element 248. A variable delay element suitable for use as the delay element 248 is described in U.S. Pat. No. 4,489,342 entitled "Mosfet Integrated Delay Circuit For Digital Signals and Its Use in Color Television Receivers", which is hereby incorporated by reference.

The amount of time by which the variable delay element 248 delays a transition of the signal MSB$_{sw}$ is determined by the values provided by the ROM 244 via the latch 246. These values, in turn, are determined by the values of the signal V$_{sw}$, representing bits 11–15 of the signal SW'. As set forth above, the values of the signal V$_{sw}$, which correspond to transitions in the signal MSB$_{sw}$, are proportional to the timing of the transition relative to the beginning or midpoint of the sawtooth waveform depending on whether the transition is positive-going or negative-going, respectively. In the present embodiment of the invention, it is desirable to delay the positive-going transitions of the signal MSB$_{sw}$ so that they occur substantially coincident with the endpoint or positive peak of the sawtooth waveform and to delay the negative going transitions of the signal MSB$_{sw}$ so that they occur substantially coincident with the midpoint of the sawtooth waveforms.

For example, as shown in FIGS. 3A through 3D, it is desirable to delay the transitions of the signal MSB$_{sw}$ occurring at times T$_3$, T$_5$ and T$_7$ by the respective amounts of time d$_1$, d$_2$ and d$_3$ to produce the transitions in the waveform MSB'$_{sw}$ occurring at times T$_3$', T$_5$' and T$_7$'.

The amount of time by which an individual transition is to be delayed is inversely proportional to the corresponding value of the signal V$_{sw}$. In this embodiment of the invention, the ROM 244 is programmed to translate the values of V$_{sw}$ into delay control values. First, the range of values of the signal V$_{sw}$ is divided into 32 equal parts and then 32 delay control values which span one-half of a period of the signal SW' are assigned to the cells of the ROM 244 that are addressed by the respective values of the signal V$_{sw}$. An example of the programming of the ROM 244 is presented below in Table II. In this example, the ROM 244 has 32 addressable storage locations numbered from zero to 31 which subdivide the values represented by the 15 LSB's of the signal SW' into 32 equal parts.

TABLE II

| Address | Delay Value | Address | Delay Value | Address | Delay Value |
|---------|-------------|---------|-------------|---------|-------------|
| 0 | 31 | 13 | 18 | 26 | 5 |
| 1 | 30 | 14 | 17 | 27 | 4 |
| 2 | 29 | 15 | 16 | 28 | 3 |
| 3 | 28 | 16 | 15 | 29 | 2 |
| 4 | 27 | 17 | 14 | 30 | 1 |
| 5 | 26 | 18 | 13 | 31 | 0 |
| 6 | 25 | 19 | 12 | | |
| 7 | 24 | 20 | 11 | | |
| 8 | 23 | 21 | 10 | | |
| 9 | 22 | 22 | 9 | | |

TABLE II-continued

| Address | Delay Value | Address | Delay Value | Address | Delay Value |
|---|---|---|---|---|---|
| 10 | 21 | 23 | 8 | | |
| 11 | 20 | 24 | 7 | | |
| 12 | 19 | 25 | 6 | | |

When a value of zero is selected from the ROM 244 for application to the control input port of the variable delay element 248, the output signal, $MSB'_{sw}$ is the same as the input signal to the delay element 248. When a value between 1 and 31 is selected, however, the output signal $MSB'_{sw}$ is equal to the signal $MSB_{sw}$, applied to the variable delay element 248, delayed by a chain of a number of inverter pairs equal to the selected value.

The circuitry 241 generates a signal $MSB'_{sw}$ having transitions which are aligned with the midpoints and endpoints of the sawtooth waveform of the signal SW'. This alignment is accurate to within the time delay defined by one inverter pair of the variable delay element 248. Assuming that $f_{sw}$ is 4.5 MHz and that the inverter pairs of the variable delay element 248 subdivide one-half of the period of the signal SW' into 32 equal time intervals, each of the transitions of the signal $MSB'_{sw}$ is accurate to within 3 ns relative to a square wave signal having a frequency of $f_{sw}'$.

The signal $MSB'_{sw}$ produced by the variable delay element 248 is applied to the reconstruction filter 250 in placc of thc signal $MSB_{sw}$ applied via the connection 235. The PLL of the reconstruction filter 250 is synchronized by the signal $MSB'_{sw}$ as set forth above to produce the signal CLOCK', which has a frequency substantially equal to 13.5 MHz and which is substantially free of any distortion related to the beat signal components of the signal $MSB_{sw}$.

What is claimed is:

1. Apparatus comprising:
   a variable oscillator, responsive to a control signal for generating an oscillatory signal having a frequency determined by the value of said control signal;
   digital signal generation means including a digital oscillator for generating a plural-bit sampled data digital oscillatory signal having a frequency which approximates a predetermined nominal frequency;
   phase comparison means, coupled to said variable oscillator and to said digital signal generation means for generating a phase difference signal proportional to the difference in phase between said oscillatory signal and a single-bit digital signal representing a predetermined bit of said plural-bit sampled data digital oscillatory signal; and
   means, coupled to said phase comparison means and responsive to said phase difference signal for generating said control signal.

2. The apparatus set forth in claim 1 wherein:
   said digital signal generation means further includes:
   a source of reference signal having a frequency which approximates a predetermined frequency;
   further phase comparison means, coupled to said source of reference signal and to said variable oscillator for generating a further phase difference signal proportional to the difference in phase between said reference signal and said oscillatory signal; and
   means, coupled to said further phase comparison means and responsive to said further phase difference signal for generating a further control signal which is applied to said digital oscillator to control the frequency of the plural-bit digital oscillatory signal provided thereby.

3. The apparatus set forth in claim 2 wherein;
   said digital signal generation means further includes a source of clock signal having a predetermined frequency;
   said digital oscillator is responsive to said clock signal for generating samples of said plural-bit sampled data digital oscillatory siganl at instants determined by said clock signal; and
   the ratio of the frequency of said clock signal to the nominal frequency of said plural-bit sampled data digital oscillatory signal is a noninteger value greater than two.

4. The apparatus set forth in claim 3 wherein said digital signal gneration means further includes:
   means, coupled to said digital oscillator for generating said single-bit digital signal representing said predetermined bit of said plural-bit sampled data digital oscillatory signal including means for delaying the occurrence of transitions in the value of the predetermined bit of said plural-bit sampled data digital oscillatory signal by respective amounts of time that are inversely proportional to the respective values represented by bits having less significance than said predetermined bit, of respective samples of said sampled data digital oscillatory signal representing the transitions in the value of said predetermined bit.

5. In a television signal processing system, apparatus comprising:
   a source of television signals including a horizontal line synchronizing signal component;
   signal separation means, coupled to said source, for separating the horizontal line synchronizing signal component from said television signals;
   first phase comparison means, coupled to said signal separation means for generating a first phase difference signal representing the difference in phase between said separated horizontal line synchronizing signal and a first oscillatory signal;
   means, coupled to said first phase comparison means and responsive to said first phase difference signal for generating a first frequency control signal;
   digital signal generation means including a digital oscillator responsive to said first frequency control signal for generating a plural-bit sampled data digital oscillatory signal having a frequency which varies about a nominal frequency by amounts determined by said first frequency control signal;
   second phase comparison means, coupled to said digital signal generation means for generating a second phase difference signal representing the difference in phase between a single-bit digital signal, representing a predetermined bit of said plural-bit sampled-data digital oscillatory signal, and a second oscillatory signal;
   means, coupled to said second phase comparison means and responsive to said second phase difference signal for generating a second frequency control signal;
   a variable oscillator, responsive to said second frequency control signal for generating an analog oscillatory signal having a frequency determined by said second frequency control signal; and
   frequency dividing means coupled to said variable oscillator for dividing the analog oscillatory signal provided thereby in frequency by first and second predetermined factors to generate said first and second oscillatory signals.

6. The apparatus set forth in claim 5 wherein:
said digital signal generation means further includes a source of clock signal having a predetermined frequency;
said digital oscillator is responsive to said clock signal for generating samples of said plural-bit sampled data digital oscillatory signal at instants determined by said clock signal; and
the ratio of the frequency of said clock signal to the nominal frequency of said plural-bit sampled data digital oscillatory signal is a noninteger value greater than two.

7. The apparatus set forth in claim 6 wherein said digital signal generation means further includes:
means, coupled to said digital oscillator for generating said single-bit digital signal representing the predetermined bit of said plural-bit sampled data digital oscillatory signal including means for delaying the occurrence of transitions in the value of the predetermined bit of said plural-bit sampled data digital oscillatory signal by respective amounts of time that are inversely proportional to the respective values represented by bits having less significance than said predetermined bit, of respective samples of said sampled data digital oscillatory signal representing the transitions in the value of said predetermined bit.

* * * * *